United States Patent [19]
Gardner et al.

[11] Patent Number: 6,153,477
[45] Date of Patent: Nov. 28, 2000

[54] ULTRA SHORT TRANSISTOR CHANNEL LENGTH FORMED USING A GATE DIELECTRIC HAVING A RELATIVELY HIGH DIELECTRIC CONSTANT

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/060,430

[22] Filed: Apr. 14, 1998

[51] Int. Cl.[7] .................................... H01L 21/336
[52] U.S. Cl. .......................... 438/286; 438/287; 438/179; 438/303; 438/305; 438/307; 438/232; 438/482
[58] Field of Search .................................... 438/287, 286, 438/240, 179, 303, 304, 305, 307, 230, 231, 232, 482, FOR 204

[56] References Cited

U.S. PATENT DOCUMENTS

| | | | |
|---|---|---|---|
| 4,258,465 | 3/1981 | Yasui et al. | 29/571 |
| 5,091,763 | 2/1992 | Sanchez | 437/913 |
| 5,364,807 | 11/1994 | Hwang | 437/44 |
| 5,462,884 | 10/1995 | Lee | 437/301 |
| 5,596,214 | 1/1997 | Endo | 257/324 |
| 5,625,217 | 4/1997 | Chau et al. | 257/412 |
| 5,654,218 | 8/1997 | Lee | 437/301 |
| 5,672,531 | 9/1997 | Gardner et al. | 437/44 |
| 5,828,104 | 10/1998 | Mizushima | 257/344 |
| 5,874,340 | 2/1999 | Gardnert et al. | 438/286 |

*Primary Examiner*—Long Pham
*Attorney, Agent, or Firm*—Kevin L. Daffer; Conley, Rose & Tayon

[57] ABSTRACT

An integrated circuit fabrication process is provided for forming a transistor in which the channel length is mandated by the width of a gate conductor formed upon a gate dielectric having a dielectric constant greater than about 3.8. The thickness of the gate dielectric may be made sufficiently large to serve as a mask during subsequent implantation of impurities into a substrate. The gate conductor and the gate dielectric are first patterned using lithography and an etch step. In one embodiment, a masking layer is then formed across a select portion of the gate conductor and an ensuing source region of the substrate. The uncovered portion of the gate conductor is etched to expose a region of the gate dielectric. A first implant of impurities is forwarded into regions of the substrate not covered by the masking layer to form an LDD area underneath the exposed region of the gate dielectric and a heavily doped drain region laterally adjacent the LDD area. A second implant is then forwarded into the source region to form a heavily doped source region. In another embodiment, the masking layer used to originally pattern the gate conductor is etched to expose portions of the gate conductor. Those exposed portions are then removed. A single implant of impurities is forwarded into the substrate exclusive of underneath the gate conductor. LDD areas are thusly formed beneath portions of the gate dielectric not covered by the gate conductor, and source/drain regions are formed laterally adjacent the LDD areas.

22 Claims, 6 Drawing Sheets

ULTRA SHORT TRANSISTOR CHANNEL LENGTH FORMED USING A GATE DIELECTRIC HAVING A RELATIVELY HIGH DIELECTRIC CONSTANT

BACKGROUND OF THE INVENTION

1. Field of the Invention

This invention relates to integrated circuit fabrication and, more particularly, to forming a symmetrical or asymmetrical transistor having an ultra short channel length dictated by the width of a gate conductor patterned upon a gate dielectric having a relatively high dielectric constant.

2. Description of the Related Art

Fabrication of a MOSFET device is well known. Generally speaking, MOSFETs are manufactured by placing an undoped polycrystalline silicon ("polysilicon") material over a relatively thin gate oxide arranged above a semiconductor substrate. The polysilicon material is patterned to form a gate conductor with source/drain regions (i.e., junctions) adjacent to and on opposite sides of the gate conductor within the substrate. The gate conductor and source/drain regions are then implanted with an impurity dopant. The gate conductor serves as a mask to an underlying channel region of the substrate during the implantation step. The implant energy is not sufficient enough to cause the dopant species to pass entirely through the gate conductor to the channel region. However, the implant energy is large enough to move the dopant species through the thin gate oxide to the underlying source/drain regions. If the dopant species employed for forming the source/drain regions is n-type, then the resulting MOSFET is an NMOSFET (n-channel) transistor device. Conversely, if the source/drain dopant species is p-type, then the resulting MOSFET is a PMOSFET (p-channel) transistor device. Integrated circuits utilize either n-channel devices exclusively, p-channel devices exclusively, or a combination of both on a single monolithic substrate.

Because of the increased desire to build faster and more complex integrated circuits it has become necessary to reduce the transistor threshold voltage, $V_T$. Several factors contribute to $V_T$, one of which is the effective channel length ("Leff") of the transistor. The initial distance between the source-side junction and the drain-side junction of a transistor is often referred to as the physical channel length. However, after implantation and subsequent diffusion of the junctions, the actual distance between junctions becomes less than the physical channel length and is often referred to as the effective channel length. In VLSI designs, as the physical channel length decreases, so too must the Leff. Decreasing Leff reduces the distance between the depletion regions associated with the source and drain of a transistor. As a result, less gate charge is required to invert the channel of a transistor having a shorter Leff. Accordingly, reducing the physical channel length, and hence the Leff, can lead to a reduction in the threshold voltage of a transistor. Consequently, the switching speed of the logic gates of an integrated circuit employing transistors with reduced Leff is faster, allowing the integrated circuit to quickly transition between logic states (i.e., operate at high frequencies).

Unfortunately, minimizing the physical channel length of a transistor is somewhat limited by conventional techniques used to define the gate conductor of the transistor. As mentioned earlier, the gate conductor is typically formed from a polysilicon material. A technique known as lithography is used to pattern a photosensitive film (i.e., photoresist) above the polysilicon material. An optical image is transferred to the photoresist by projecting a form of radiation, typically ultraviolet light, through the transparent portions of a mask plate. The solubility of photoresist regions exposed to the radiation is altered by a photochemical reaction. The photoresist is washed with a solvent that preferentially removes resist areas of higher solubility. Those exposed portions of the polysilicon material not protected by photoresist are etched away, defining the geometric shape of a polysilicon gate conductor.

The lateral width (i.e., the distance between opposed sidewall surfaces) of the gate conductor which dictates the physical channel length of a transistor is thus defined by the lateral width of an overlying photoresist layer. The minimum lateral dimension that can be achieved for a patterned photoresist layer is unfortunately limited by, inter alia, the resolution of the optical system (i.e., aligner or printer) used to project the image onto the photoresist. The term "resolution" describes the ability of an optical system to distinguish closely spaced objects. Diffraction effects may undesirably occur as the radiation passes through slit-like transparent regions of the mask plate, scattering the radiation and therefore adversely affecting the resolution of the optical system. As such, the features patterned upon a masking plate may be skewed, enlarged, shortened, or otherwise incorrectly printed onto the photoresist.

Reducing the Leff of a transistor to below 1.0 µm may lead to deleterious short channel effects ("SCE"). Generally speaking, SCE impacts device operation by, for example, increasing sub-threshold currents. A problem related to SCE and the subthreshold currents associated therewith, but altogether different, is the problem of hot-carrier effects ("HCE"). HCE is a phenomena by which the kinetic energy of the charge carriers (holes or electrons) is increased as the carriers are accelerated through large potential gradients and subsequently become trapped within the gate oxide. The greatest potential gradient, often referred to as the maximum electric field ("Em"), occurs near the drain during saturated operation of a transistor. More specifically, the electric field is predominant at the lateral junction of the drain adjacent the channel. As hot electrons travel to the drain, they lose their energy by a process called impact ionization. Impact ionization serves to generate electron-hole pairs which migrate to and become injected within the gate dielectric near the drain junction. Vacancy and interstitial positions within the gate dielectric generally become electron traps, resulting in a net negative charge density within the gate dielectric. Unfortunately, the trapped charge may accumulate over time, causing the transistor threshold voltage to undesirably shift from its design specification. It is known that since hot electrons are more mobile than hot holes, HCE causes a greater threshold skew in NMOS transistors than PMOS transistors. Nonetheless, a PMOS transistor will undergo negative threshold skew if its Leff is less than, e.g., 0.8 µm.

To overcome the problems related to HCE, an alternative drain structure known as the lightly doped drain ("LDD") has grown in popularity. The LDD structure advantageously absorbs some of the potential into the drain and thus reduces Em. A to conventional LDD structure is one in which a light concentration of dopant is self-aligned to the gate conductor followed by a heavier concentration of dopant self-aligned to the gate conductor on which two sidewall spacers have been formed. The purpose of the first implant dose is to produce a lightly doped section (i.e., an LDD area) at the gate edge immediately adjacent the channel. The second implant dose forms a heavily doped source/drain region spaced from the channel a distance dictated by the thickness of the sidewall spacer. A dopant gradient (i.e., graded junction) therefore results at the interface between the LDD area and the channel as well as between the LDD area and the source/drain region. The addition of an LDD implant adjacent the channel unfortunately adds capacitance and resistance to the source/drain pathway. This added resistance, generally known as parasitic resistance, can have many deleterious effects. For example, parasitic resistance can decrease the saturation drive current and the overall speed of the transistor. While it would seem beneficial to decrease both the drain-side parasitic resistance $R_D$ and the source-side parasitic resistance $R_S$, the drain-side parasitic resistance is nonetheless needed to minimize HCE. Accordingly, proper LDD design must take into account the need for minimizing parasitic resistance at the source-side while at the same time attenuating Em at the drain-side of the channel.

It would therefore be desirable to develop a transistor fabrication technique in which the channel length of the transistor is reduced to provide for high frequency operation of an integrated circuit employing the transistor. More specifically, a process is needed in which the channel length is no longer dictated by the resolution of a lithography optical aligner, or dual sides of a masking structure. Thus, the Leff of a transistor must no longer be mandated by the lateral width of a lithographically patterned gate conductor. While minimizing Leff might afford high frequency operation of a transistor, it could also give rise to deleterious drain-side hot carrier injection into the gate dielectric. It would therefore be of benefit to develop an asymmetrical LDD design which serves to attenuate the maximum electric field Em in the critical drain area while reducing parasitic resistance $R_S$ in the source area. Such an LDD design would allow Leff to be reduced without being concerned that the transistor might experience problems associated with HCE and SCE as well as a reduction in saturation drive current.

SUMMARY OF THE INVENTION

The problems outlined above are in large part solved by the technique hereof for fabricating a transistor in which the channel length is mandated by the lateral width of a gate conductor formed upon a gate dielectric having a dielectric constant K greater than about 3.8 (i.e., greater than the K value of silicon dioxide). The high K value of the gate dielectric advantageously allows the vertical thickness of the gate dielectric to be increased without being concerned that gate-to-substrate capacitance will be lost. In other words, the thickness of the gate dielectric can be increased and still achieve the same transistor threshold voltage $V_T$ as a gate dielectric composed of a material having a lower K value, e.g., silicon dioxide. Accordingly, the thickness of the gate dielectric may be made sufficiently large to serve as a mask during subsequent implantation of impurities into a semiconductor substrate which extends beneath and horizontally beyond the gate dielectric.

Two masking steps are advantageously employed to minimize the width of the gate conductor. A first masking layer having a width no less than the minimum lateral dimension definable by lithography is formed upon the gate conductor. Portions of the gate conductor and the underlying gate dielectric not covered by the first masking layer are then etched to the underlying substrate. As a result, the gate conductor and the gate dielectric each have a lateral width equivalent to that of the first masking layer. Thereafter, a second masking layer is formed over a select portion of the gate conductor. In a first embodiment, the second masking layer is lithographically patterned such that it extends across an ensuing source region of the substrate and terminates upon the gate conductor between a pair of opposed sidewall surfaces bounding the gate conductor. An exposed portion of the gate conductor is etched to the gate dielectric to expose a select region of the gate dielectric, thereby reducing the width of the gate conductor. Thus, the place where the second masking layer terminates upon the gate conductor may be shifted laterally to scale the width of the gate conductor. In particular, the lateral boundary of the second masking layer may be shifted toward the ensuing source region to reduce the gate length (i.e., lateral width of the gate conductor).

In a second embodiment, the second masking layer is formed by isotropically etching (i.e., etching in a vertical direction at substantially the same rate as in a horizontal direction) the first masking layer such that the second masking layer is laterally spaced from the opposed sidewall surfaces of the gate conductor. The end portions of the gate conductor uncovered by the second masking layer are then etched to the upper surface of the gate dielectric to expose select regions of the gate dielectric. The lateral width of the second masking layer dictates the width of the gate conductor. Accordingly, the duration of the isotropic etch of the masking layer may be varied to scale the width of the gate conductor. Increasing the isotropic etch duration results in the gate length being reduced. Therefore, a gate conductor having a lateral width less than the minimum feature size definable by lithography may be patterned exclusively above a select portion of the gate dielectric.

According to the first embodiment, a first impurity distribution may be forwarded to the substrate while the second masking layer is retained across the ensuing source region subsequent to reducing the gate length of the gate conductor. A heavily doped drain region is thusly formed within an exposed portion of the substrate laterally adjacent an exposed lateral boundary of the gate dielectric. The thickness of the select portion of the gate dielectric not residing underneath the gate conductor is preferably small enough to allow a portion of the dopant species passing therethrough to be implanted into the substrate. The thickness of the select portion of the gate dielectric is also preferably sufficient to block the passage of some of the dopant species to the substrate. Therefore, the first impurity distribution also forms a lightly doped drain area which is shallower than and has a lower concentration of dopant than the heavily doped drain region within the substrate directly underneath the uncovered select portion of the gate dielectric. After removing the second masking layer from the substrate, a second impurity distribution may be forwarded into regions of the substrate exclusive of underneath the gate conductor. As a result of the second implant, a heavily doped source region is formed within an exposed region of the substrate laterally adjacent the gate dielectric and aligned to a sidewall surface of the gate conductor. The combined thicknesses of the gate conductor and the gate dielectric serve to inhibit dopant species from passing into the underlying channel region of the substrate. As such, the shortened gate length of the gate conductor dictates the physical channel length, and hence the Leff, of the ensuing transistor. Moreover, a substantial portion of the dopant species forwarded into the uncovered select portion of the gate dielectric is unable to diffuse completely through the gate dielectric to the lightly doped drain region. Accordingly, the dopant concentration within the lightly doped drain region is not increased significantly by the second implant.

The transistor resulting from the first embodiment is asymmetrical since an LDD area is purposefully formed solely between the channel and the heavily doped drain region while the heavily doped source region is formed immediately adjacent the channel. The problems typically associated with reducing the Leff of a MOSFET transistor, particularly an NMOSFET transistor, are alleviated by the asymmetrical configuration hereof. The resulting drain-engineered structure serves to attenuate the maximum electric field Em in the critical drain area while reducing parasitic resistance Rs proximate the source area. As a result of the present LDD design, the transistor receives the benefit of reduced HCE but not at the expense of performance (i.e., switching speed or saturation drive current). Even when Leff is less than 1.0 $\mu$m, where SCE would normally be a problem, the present LDD-embodied transistors experience minimal sub-threshold currents. The second impurity distribution preferably comprises a dopant species having a relatively low diffusivity, e.g., arsenic, and thereby provides for the formation of a relatively shallow heavily doped source region. Reducing the depth of the source region advantageously affords an increase in drive current $I_D$ of the ensuing transistor without a detrimental increase in the parasitic resistance in the source region. However, a similar decrease in the depth of the heavily doped drain region might lead to an unwanted rise in the parasitic resistance in the drain region. As such, the dopant species of the first impurity distribution preferably has a higher diffusivity than the dopant species of the second impurity distribution, resulting in the heavily doped source region being shallower than the heavily doped drain region.

According to the second embodiment, a single implant of dopant species is forwarded into the substrate subsequent to forming the gate conductor upon a select portion of a gate dielectric. The gate conductor and the select portion of the gate dielectric underlying the gate conductor serve as a mask to the channel region of the substrate during the implant. LDD areas which are spaced apart by the channel region are formed within the substrate beneath the uncovered portions of the gate dielectric as a result of the implant. Also, heavily doped source and drain regions which each have a lateral boundary aligned to one of the lateral boundaries of the gate dielectric are formed within exposed regions of the substrate laterally adjacent the LDD areas. The atoms present in the uncovered portions of the gate dielectric block the migration pathways of the ionic species passing therethrough such that only a portion of the species reach the substrate. Furthermore, as the ionic species and the atoms in the gate dielectric collide, the energy of the dopant species is decreased. Therefore, the LDD areas are shallower and have a lower concentration of dopant species than the source and drain regions. Optionally, impurities may be implanted into exposed regions of the substrate to cause amorphization of the single crystalline silicon residing near the surface of the substrate prior to performing the single implant of dopant species. The impurities used to amorphize the substrate surfaces may comprise silicon or germanium. In this manner, layers of amorphous silicon are formed within the upper portions of the substrate. Therefore, when dopant species are subsequently implanted into the substrate, the depth of the "effective" heavily doped source and drain regions (i.e., the non-amorphized implanted regions) which extend below the amorphous silicon layers is reduced. A transistor having such shallow effective source and drain regions arranged beneath amorphous silicon layers advantageously exhibits increased drive current without a detrimental rise in the source-side and drain-side parasitic resistances.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
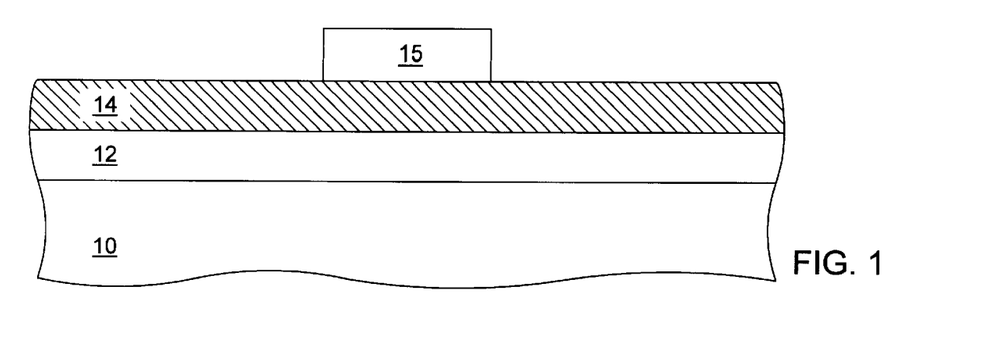
FIG. 1 is a cross-sectional view of a semiconductor topography according to a first embodiment of the present invention, wherein a gate conductor and a gate dielectric having a relatively high K value are arranged across a semiconductor substrate and a first masking layer is lithographically patterned across a select portion of the gate conductor.

FIGS. 1–9 illustrate the formation of a transistor according to one embodiment of the present invention. Turning to FIG. 1, a single crystalline silicon substrate 10 is depicted upon which a gate dielectric 12 has been deposited. Substrate 10 is slightly doped with p-type or n-type dopant species. Isolation structures may be arranged at spaced distances apart within substrate 10 to isolate ensuing active areas from each other. Gate dielectric 12 is preferably a dielectric material having a dielectric constant, K, greater than about 3.8. Examples of appropriate high K dielectric materials include, but are not limited to, barium strontium titanate, lead lanthanum zirconate titanate, barium zirconate titanate, cerium oxide, and tin oxide. The gate dielectric 12 may have a thickness ranging from about 200 Å to 1500 Å, depending somewhat on the K value of the dielectric and the desired threshold voltage of the ensuing transistor. A gate conductor 14 has been deposited across gate dielectric 12. Gate conductor 14 is preferably polysilicon which has been chemically-vapor deposited ("CVD") from, e.g., a silane source. The composition of gate conductor 14 is not limited to polysilicon and may also be composed of other semiconductive or conductive materials, such as tungsten and aluminum. A masking layer 15 may be formed upon a select portion of gate conductor 14 using optical lithography. Preferably, masking layer 15 comprises photoresist but may also include any material dissimilar to polysilicon. If masking layer 15 is not composed of photoresist, it may be formed by etching away portions of the masking layer not covered by an overlying photoresist layer. The lateral width of masking layer 15 thus cannot be reduced below the minimum feature size that can be patterned using lithography.

Figure 2:
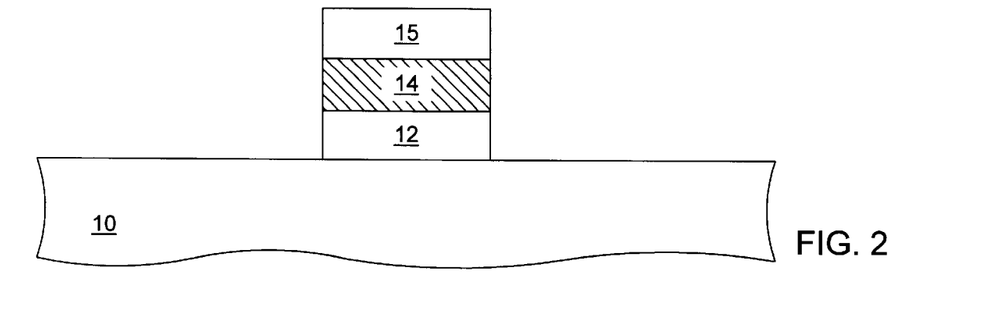
FIG. 2 is a cross-sectional view of the semiconductor topography, wherein portions of the gate conductor and the gate dielectric not covered by the first masking layer are removed to define opposed sidewall surfaces and opposed lateral boundaries at peripheral regions of the gate conductor and the gate dielectric, respectively, subsequent to the step in FIG. 1.
Figure 3:
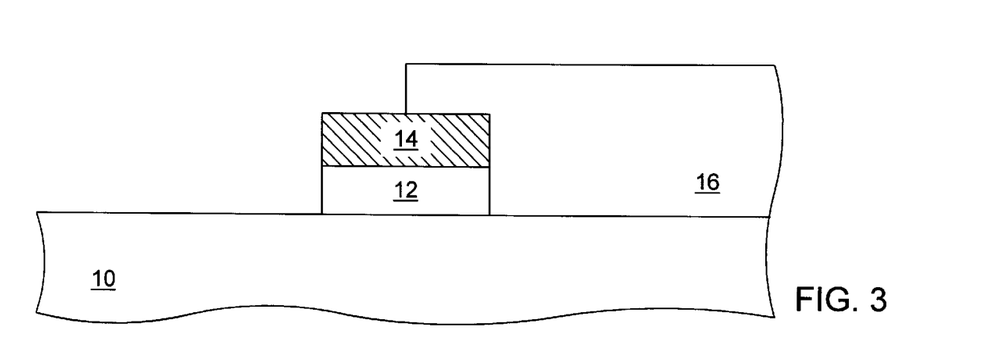
FIG. 3 is a cross-sectional view of the semiconductor topography, wherein the first masking layer is removed and a second masking layer is formed across a select portion of the gate conductor, subsequent to the step in FIG. 2.
Figure 4:
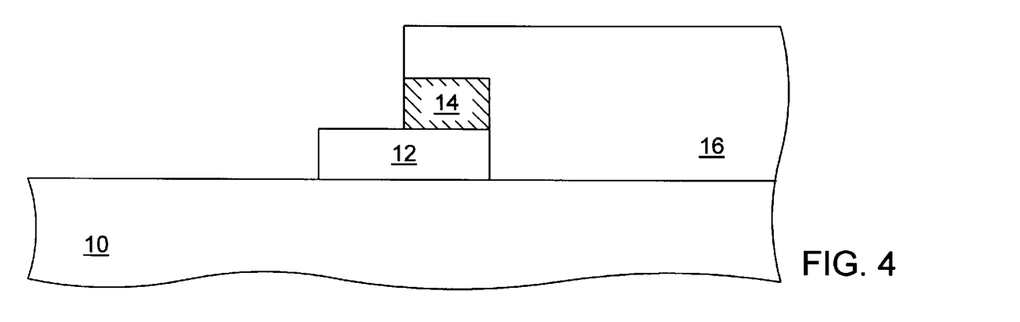
FIG. 4 is a cross-sectional view of the semiconductor topography, wherein an exposed portion of the gate conductor uncovered by the second masking layer is etched to the upper surface of the gate dielectric, subsequent to the step in FIG. 3.

As shown in FIG. 2, portions of gate conductor 14 and gate dielectric 12 not covered by masking layer 15 are then removed using an etch technique, e.g., a dry, anisotropic etch. Masking layer 15 is not significantly etched and thus remains intact above a select portion of gate conductor 14. The etch duration is chosen to terminate before substantial portions of substrate 10 can be removed. Using an anisotropic etch affords ion ablation of horizontally oriented surfaces at a faster rate than vertically oriented surfaces. As a result, opposed sidewall surfaces arranged about the periphery of gate conductor 14 and opposed lateral boundaries arranged about the periphery of gate dielectric 12 are formed which extend vertically above substrate 10. FIG. 3 illustrates the formation of another masking layer 16 across a portion of substrate 10 and a select region of gate conductor 14 after the removal of masking layer 15 from gate conductor 14. An exposed lateral surface arranged at the boundary of masking layer 16 is defined using optical lithography. Masking layer 16 preferably comprises photoresist, but may also comprise another material dissimilar to the gate conductor material. Preferably, masking layer 16 exposes approximately half or greater than half of the lateral width of gate conductor 14. Turning to FIG. 4, the exposed portion of gate conductor 14 not covered by masking layer 16 is then etched to the upper surface of gate dielectric 12 using, e.g., an anisotropic etch technique. In this manner, a portion of the upper surface of gate dielectric 12 is exposed, and the lateral width of gate conductor 14 is reduced such that it is preferably 50% or less than 50% of its original width. The position of the lateral surface of masking layer 16 upon gate conductor 14 dictates the lateral width of the gate conductor. Accordingly, the gate conductor width may be scaled to less than the minimum definable dimension of lithography (e.g., less than 0.2 micron).

Figure 5:
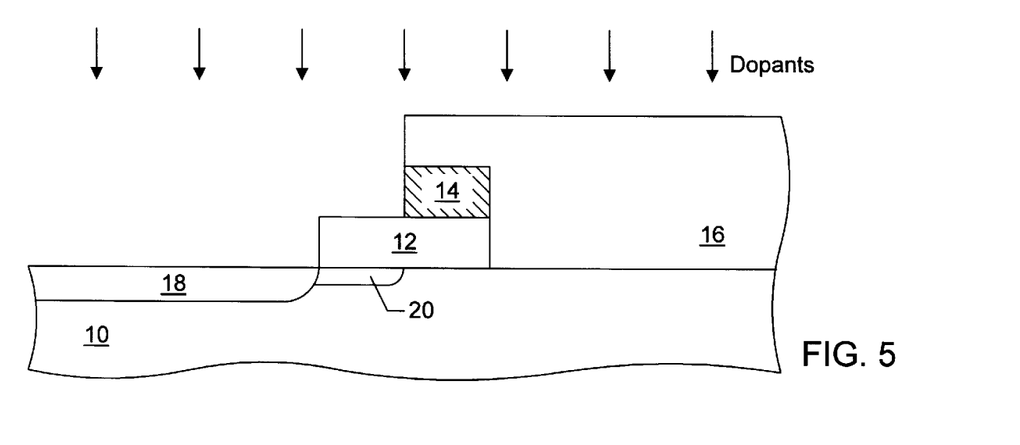
FIG. 5 is a cross-sectional view of the semiconductor topography, wherein dopant species are implanted into the substrate exclusive of underneath the masking layer to form an LDD area and a heavily doped drain region within the substrate, subsequent to the step in FIG. 4.

Subsequently, as shown in FIG. 5, a first impurity distribution is implanted into regions of substrate 10 not covered by masking layer 16. If a PMOSFET transistor is being fabricated, p-type dopant species are implanted, and if an NMOSFET transistor is being fabricated, n-type dopant species are implanted. Some commonly used p-type dopants are boron or boron difluoride, and some commonly used n-type dopants are arsenic or phosphorus. The implanted dopant species are opposite in type to the dopant species positioned within the channel region of substrate 10 positioned directly below gate conductor 14. As a result of the implant, an LDD area 20 is formed on the drain-side of the ensuing transistor within substrate 10 directly underneath the uncovered portion of gate dielectric 12. Further, a heavily doped drain region 18 is formed within substrate 10 laterally adjacent LDD area 20 aligned to a lateral boundary of gate dielectric 12. LDD area 20 contains a lower concentration of dopant and extends to a shallower depth in substrate 10 than drain region 18.

Figure 6:
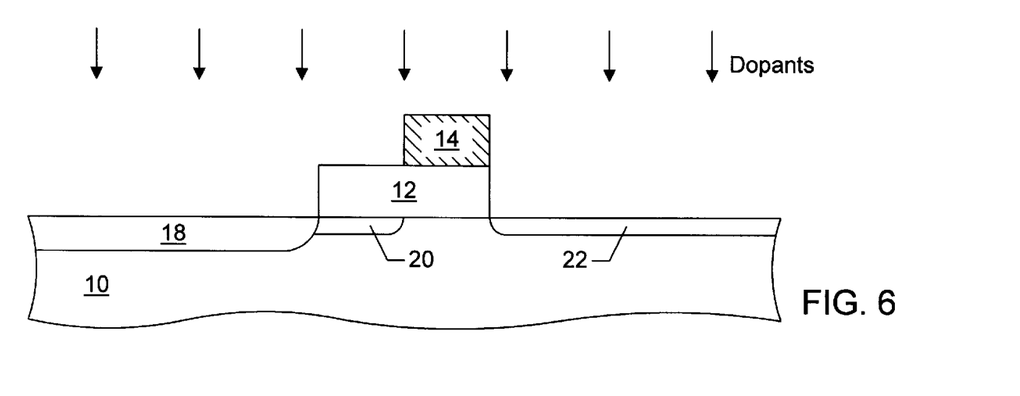
FIG. 6 is a cross-sectional view of the semiconductor topography, wherein the second masking layer is removed and dopant species having a relatively low diffusivity are implanted into the substrate exclusive of underneath the gate conductor to form a heavily doped source region within the substrate, subsequent to the step in FIG. 5.

FIG. 6 depicts a second impurity distribution being implanted into portions of substrate 10 not masked by an overlying gate conductor 14. Masking layer 16 is stripped from gate conductor 14 prior to the implant. The second impurity distribution preferably comprises a dopant species of the same type but having a lower diffusivity than the dopant species of the first impurity distribution. Therefore, a heavily doped source region 22 which is shallower than drain region 18 is formed within substrate 22 a spaced distance from LDD area 20 and aligned to an opposed sidewall surface of gate conductor 14. The diffusivity of the dopant species is sufficiently low enough and the thickness of gate dielectric 12 is sufficiently large enough to inhibit a significant portion of the dopant species from passing into LDD area 20. As such, the lightly doped characteristic of LDD area 20 is retained. Since drain region 18 contains a high concentration of pre-existing dopant species, the dopant species of the second impurity distribution only serves to enhance the heavily doped nature of drain region 18. The combined thicknesses of gate conductor 14 and gate dielectric 12 are preferably adequate enough to substantially inhibit dopant species from entering the channel region of substrate 10. In this manner, an asymmetrical transistor is formed in which an LDD area is formed exclusively on the drain-side of the transistor. Substrate 10 may subsequently be annealed to activate and position the as-implanted impurities.

Figure 7:
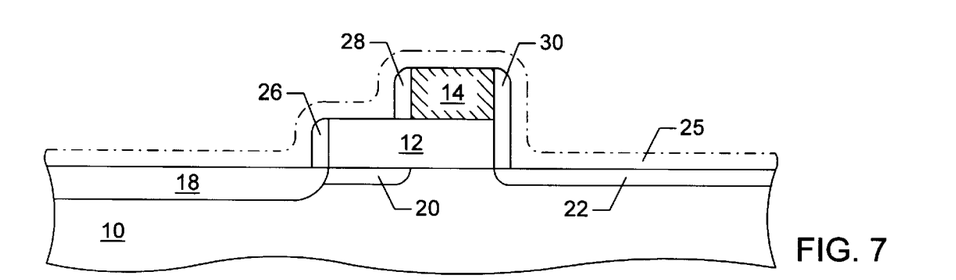
FIG. 7 is a cross-sectional view of the semiconductor topography, wherein dielectric sidewall spacers are formed upon the opposed sidewall surfaces of the gate conductor and the opposed lateral boundaries of the gate dielectric, subsequent to the step in FIG. 6.
Figure 8:
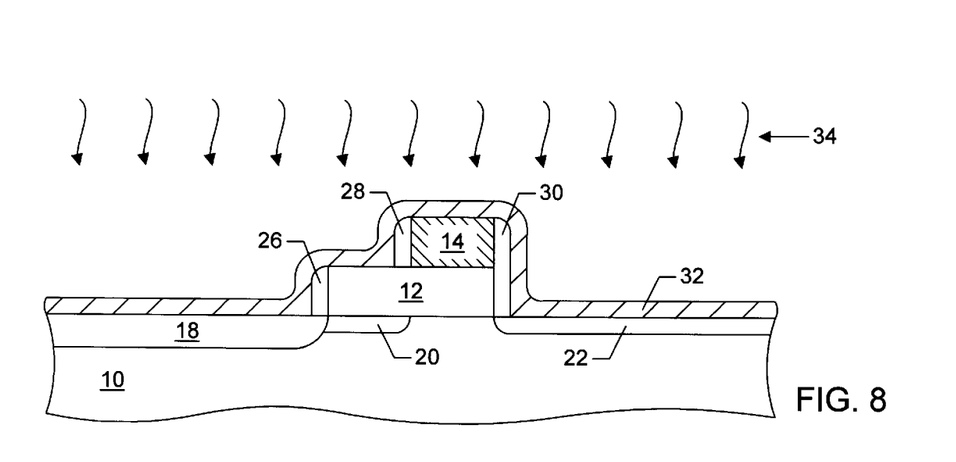
FIG. 8 is a cross-sectional view of the semiconductor topography, wherein a refractory metal is deposited across the topography and exposed to a heat cycle to initiate reaction between silicon within the substrate and overlying metal, subsequent to the step in FIG. 7.
Figure 9:
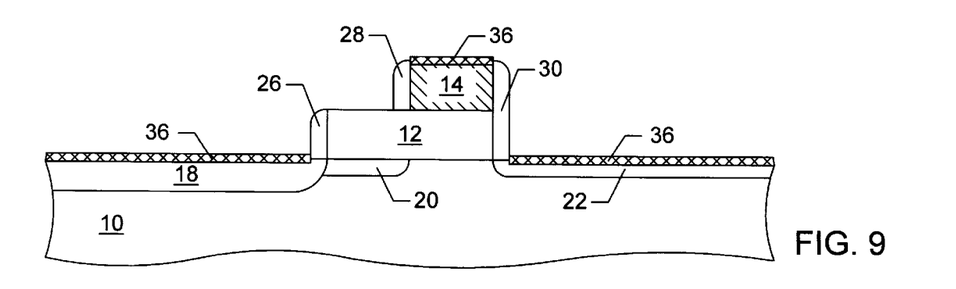
FIG. 9 is a cross-sectional view of the semiconductor topography, wherein metal silicide is formed exclusively upon the heavily doped source and drain regions and the upper surface of the gate conductor; subsequent to the step in FIG. 8.

Turning to FIG. 7, dielectric sidewall spacers 26, 28, and 30 may be formed which extend laterally from the opposed lateral boundaries of gate dielectric 12 and the opposed sidewall surfaces bounding gate conductor 14. Sidewall spacers 26, 28, and 30 may be formed by first depositing a spacer material across exposed surfaces of substrate 10, gate dielectric 12, and gate conductor 14. The spacer material is preferably composed of silicon dioxide, silicon nitride, or silicon oxynitride, but may be composed of other dielectric materials. The spacer material is then anisotropically etched such that a portion 25 of the spacer material is removed. The etch duration is chosen to terminate after the spacer material only remains laterally adjacent the opposed lateral boundaries of gate dielectric 12 and the opposed sidewall surfaces bounding gate conductor 14. FIG. 8 depicts a refractory metal 32, e.g., titanium or cobalt, being deposited across the semiconductor topography using either sputter deposition from a metal target or metal organic chemical vapor deposition ("MOCVD") from a gas comprising a metal organic-containing compound. As shown in FIG. 8, metal 32 is then exposed to a form of radiation 34 supplied from either an annealing furnace or a Rapid Thermal Anneal ("RTA") chamber. As a result of being subjected to a heat cycle, metal 32 reacts with underlying silicon of substrate 10 and polysilicon gate conductor 14 to form a metal silicide. Unreacted portions of refractory metal 32 are then removed using an etch technique which is highly selective to the metal. Consequently, self-aligned silicide (i.e., salicide) structures 36 are formed exclusively upon drain region 18, source region 22, and the upper surface of gate conductor 14. The presence of sidewall spacers 28 and 30 inhibits silicide from forming laterally adjacent the opposed sidewall surfaces of gate conductor 14 and provides for better planarization of materials subsequently formed across the topography. While the thickness of gate dielectric 12 reduces the possibility of silicide forming a short between gate conductor 14 and source and drain regions 18 and 22, the presence of sidewall spacers 26, 28, and 30 almost eliminates the chance of this ever happening.

Figure 10:
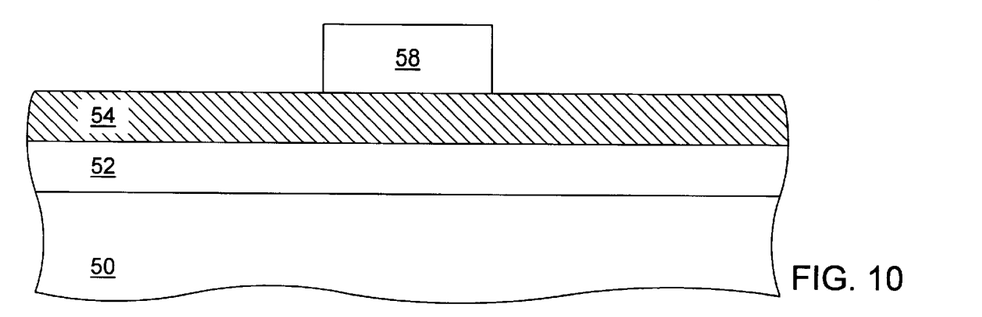
FIG. 10 is a cross-sectional view of a semiconductor topography according to a second embodiment of the present invention, wherein a gate conductor and a gate dielectric having a relatively high K value are arranged across a semiconductor substrate and a masking layer is lithographically patterned upon a select portion of the gate conductor.

FIGS. 10–18 demonstrate the formation of a transistor according to another embodiment of the present invention. Turning to FIG. 10, a single crystalline silicon substrate 50 is depicted upon which a gate dielectric 52 has been deposited. Substrate 50 is slightly doped with p-type or n-type dopant species. Isolation structures may be arranged at spaced distances apart within substrate 50 to separate ensuing active areas from each other. Gate dielectric 52 is preferably a dielectric material having a dielectric constant, K, greater than about 3.8. Examples of appropriate high K dielectric materials include, but are not limited to, barium strontium titanate, lead lanthanum zirconate titanate, barium zirconate titanate, cerium oxide, and tin oxide. The gate dielectric 52 may have a thickness ranging from about 200 Å to 1500 Å, depending somewhat on the K value of the dielectric and the desired threshold voltage of the ensuing transistor. A gate conductor 54 has been deposited across gate dielectric 52. Gate conductor 54 is preferably polysilicon which has been chemically-vapor deposited ("CVD") from, e.g., a silane source. The composition of gate conductor 54 is not limited to polysilicon and may also be composed of other semiconductive or conductive materials, such as tungsten or aluminum. A masking layer 58 may be formed upon a select portion of gate conductor 54 using optical lithography. Preferably, masking layer 58 comprises photoresist but may also be composed of any material dissimilar to polysilicon. If masking layer 58 is not composed of photoresist, it may be formed by etching away portions of the masking layer not covered by an overlying photoresist layer. The lateral width of masking layer 58 thus cannot be reduced below the minimum feature size that can be patterned using lithography.

Figure 11:
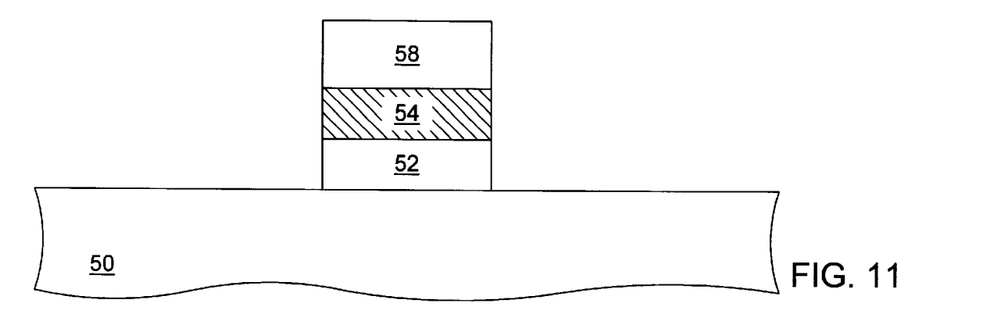
FIG. 11 is a cross-sectional view of the semiconductor topography, wherein portions of the gate conductor and the gate dielectric uncovered by the masking layer are removed to define opposed sidewall surfaces and opposed lateral boundaries at peripheral regions of the gate conductor and the gate dielectric, respectively, subsequent to the step in FIG. 10.
Figure 12:
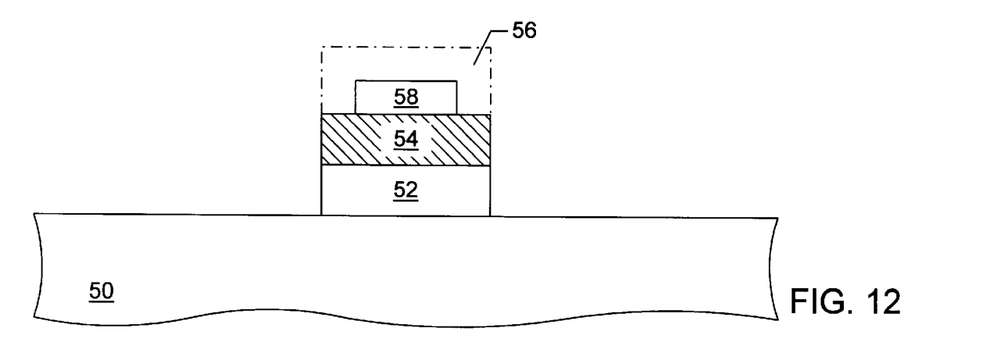
FIG. 12 is a cross-sectional view of the semiconductor topography, wherein the masking layer is isotropically etched to reduce the lateral width of the masking layer, thereby exposing portions of the gate conductor, subsequent to the step in FIG. 11.

As shown in FIG. 11, portions of gate conductor 54 and gate dielectric 54 not covered by masking layer 58 are then removed using an etch technique, e.g., a dry, anisotropic etch. Masking layer 58 is not significantly etched and thus remains intact above a select portion of gate conductor 54. The etch duration is chosen to terminate before substantial portions of substrate 50 can be removed. Using an anisotropic etch affords ion ablation of horizontally oriented surfaces at a faster rate than vertically oriented surfaces. As a result, opposed sidewall surfaces arranged about the periphery of gate conductor 54 and opposed lateral boundaries arranged about the periphery of gate dielectric 52 are formed such that they extend vertically above substrate 50. Turning to FIG. 12, masking layer 58 is then subjected to an isotropic etch which exhibits a high selectivity to the masking layer material relative to the gate conductor material and the gate dielectric material. As a result of the isotropic etch, a portion 56 of masking layer 58 is removed, and the lateral width of masking layer 58 is reduced. Accordingly, the lateral width of masking layer 58 may be less than the minimum feature size definable using lithography. The lateral sidewalls which encompass masking layer 58 are thus spaced laterally from the opposed sidewall surfaces of gate conductor 54. Portions of gate conductor 54 not covered by masking layer 58 are then etched using, e.g., an anisotropic etch technique for the time duration required to expose select regions of the upper surface of gate dielectric 52.

Figure 13:
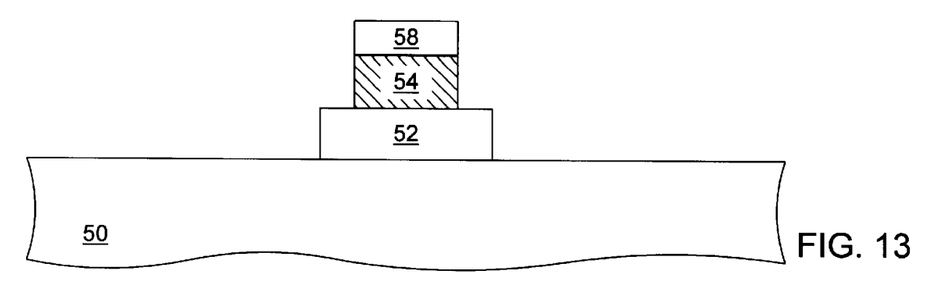
FIG. 13 is a cross-sectional view of the semiconductor topography, wherein portions of the gate conductor exclusive of underneath the masking layer are etched to the upper surface of the gate dielectric, subsequent to the step in FIG. 12.
Figure 14:
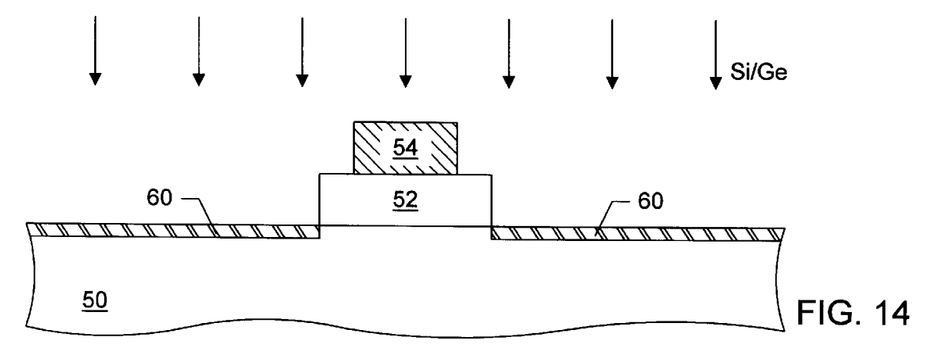
FIG. 14 is a cross-sectional view of the semiconductor topography, wherein Si or Ge is implanted into exposed upper portions of the substrate to amorphize the single crystalline silicon therein, subsequent to the step in FIG. 13.
Figure 15:
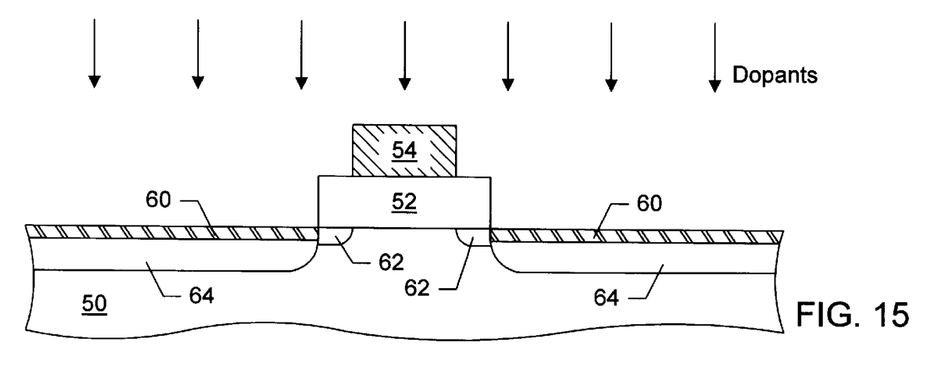
FIG. 15 is a cross-sectional view of the semiconductor topography, wherein a single implant of dopant species is forwarded into regions of the substrate exclusive of underneath the gate conductor to simultaneously form LDD areas and heavily doped source and drain regions within the substrate, subsequent to the step in FIG. 14.

An optional processing step subsequent to the step shown in FIG. 13 is depicted in FIG. 14. Silicon or germanium ions may be implanted to a relatively shallow depth into exposed portions of substrate 50. The additional atoms which are thusly placed within substrate 50 disrupt the long range order of the silicon lattice, and thereby lead to the formation of amorphous silicon layers 60 proximate the upper surface of substrate 50. Turning to FIG. 15, a unitary implant of dopant species may be forwarded into regions of substrate 50 exclusive of underneath gate conductor 54. The combined thicknesses of gate conductor 54 and gate dielectric 52 serve to inhibit dopant species from being implanted into the channel region of substrate 50 underneath gate conductor 54. LDD areas 62 are formed underneath the exposed (uncovered) portions of gate dielectric 52 and heavily doped source and drain regions 64 are formed laterally adjacent LDD areas 62. The thickness of gate dielectric 52 is sufficient to inhibit a portion of the dopant species implanted therein from reaching LDD areas 62. As such, LDD areas 62 extend to a lower depth below the substrate surface and contain a lighter concentration of dopant than source and drain regions 62. If amorphous layers 60 are present within substrate 50, the depth of the "effective" source and drain regions 64 is reduced. The additional amorphous layers 60 lower the energy of the dopant species passing to underlying regions of substrate 50. A transistor having graded source-side and drain-side junctions which decrease in dopant concentration in a lateral direction toward gate conductor 54 are thus formed within substrate 50. The graded junctions may be subsequently annealed to activate and position the as-implanted species.

Figure 16:
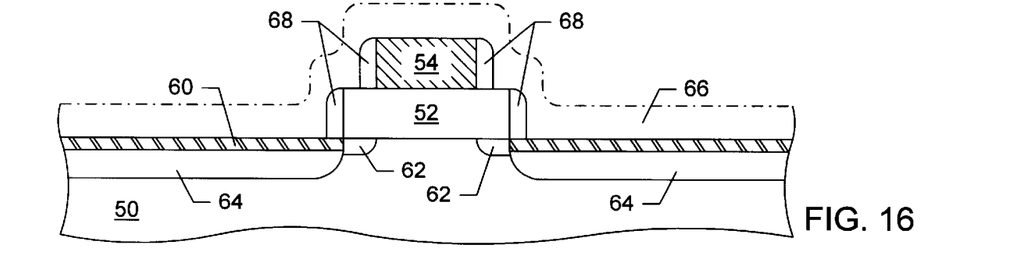
FIG. 16 is a cross-sectional view of the semiconductor topography, wherein dielectric sidewall spacers are formed upon the opposed sidewall surfaces of the gate conductor and the opposed lateral boundaries of the gate dielectric, subsequent to the step in FIG. 15.
Figure 17:
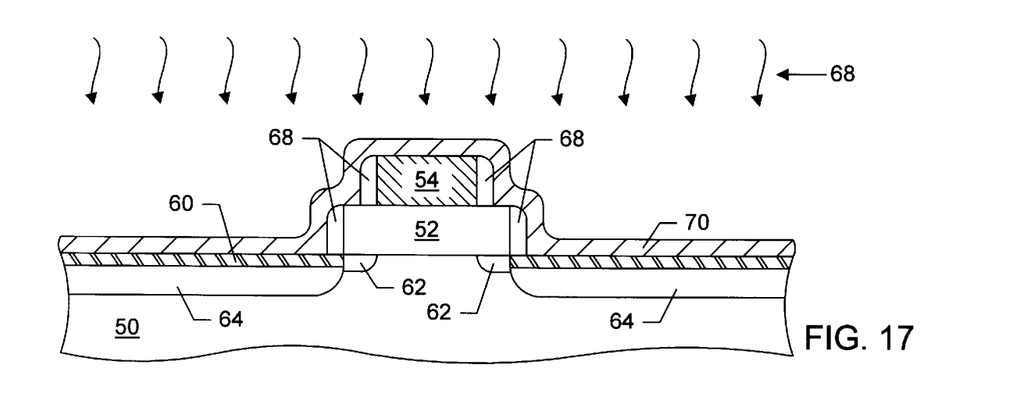
FIG. 17 is a cross-sectional view of the semiconductor topography, wherein a refractory metal is deposited across the topography and exposed to a heat cycle to initiate reaction between silicon within the substrate and overlying metal, subsequent to the step in FIG. 16.
Figure 18:
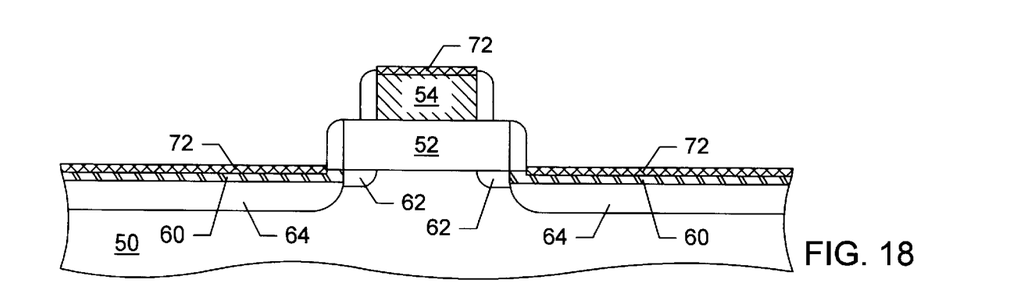
FIG. 18 is a cross-sectional view of the semiconductor topography, wherein metal silicide is formed exclusively upon the heavily doped source and drain regions and the upper surface of the gate conductor; subsequent to the step in FIG. 17.

Turning to FIG. 16, dielectric sidewall spacers 68 may be formed which extend laterally from the opposed lateral boundaries of gate dielectric 52 and the opposed sidewall surfaces bounding gate conductor 54. Sidewall spacers 68 may be formed by first depositing a spacer material across exposed surfaces of substrate 50, gate dielectric 52, and gate conductor 54. The spacer material is preferably composed of silicon dioxide, silicon nitride, or silicon oxynitride, but may also be composed of other dielectric materials. The spacer material is anisotropically etched such that a portion 66 of the spacer material is removed. The etch duration is chosen to terminate after the spacer material only remains laterally adjacent the opposed lateral boundaries of gate dielectric 52 and the opposed sidewall surfaces bounding gate conductor 54. FIG. 17 depicts a refractory metal 70, e.g., titanium or cobalt, being sputter deposited or MOCVD deposited across the semiconductor topography. As shown in FIG. 17, metal 70 is then heated by being subjected to a form of radiation 68 supplied from either an annealing furnace or an RTA. As a result of being heated, metal 70 reacts with underlying silicon of substrate 50 or polysilicon gate conductor 54 to form a metal silicide. Unreacted portions of refractory metal 70 are then removed using an etch technique which is highly selective to the metal. Consequently, self-aligned silicide (i.e., salicide) structures 72 are formed exclusively upon source and drain regions 64 and the upper surface of gate conductor 54.

It will be appreciated to those skilled in the art having the benefit of this disclosure that this invention is believed to provide a method for forming a transistor having an ultra short channel length dictated by the width of a gate conductor patterned upon a gate dielectric having a relatively high dielectric constant. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming a transistor, comprising:

forming a gate conductor upon a gate dielectric having a dielectric constant greater than approximately 3.8, wherein the gate conductor is interposed between a pair of opposed sidewall surfaces of the gate dielectric and wherein the gate dielectric is arranged upon a portion of a semiconductor substrate;

forming a masking layer across a portion of the gate conductor and a source region of the semiconductor substrate, the source region having a lateral boundary aligned to one of the opposed sidewall surfaces, wherein the portion of the gate conductor extends between said one of the opposed sidewall surfaces and a region of the gate conductor positioned between the opposed sidewall surfaces;

removing the gate conductor from the gate dielectric exclusive of the portion of the gate conductor and adjacent to the portion of the gate conductor, thereby exposing a selected region of the gate dielectric;

forwarding a first impurity distribution into the substrate exclusive of underneath the masking layer to concurrently form a lightly doped drain area within the substrate exclusively underneath the selected region of the gate dielectric and a heavily doped drain region within the substrate laterally adjacent the lightly doped drain area, and removing the masking layer from the source region subsequent to said forwarding.

2. The method of claim 1, wherein a first concentration of dopant species within the heavily doped drain region is substantially greater than a second concentration of dopant species within the lightly doped drain area.

3. The method of claim 1, wherein said forming a masking layer comprises lithographically patterning photoresist across the portion of the gate conductor.

4. The method of claim 1, further comprising forwarding a second impurity distribution into the source region of the substrate to form a heavily doped source region.

5. The method of claim 4, wherein the first impurity distribution and the second impurity distribution comprise dissimilar dopant species.

6. The method of claim 4, wherein the first impurity distribution comprises a first dopant species, and wherein the second impurity distribution comprises a second dopant species having a lower diffusivity than the first dopant species.

7. The method of claim 6, wherein the heavily doped source region is substantially shallower than the heavily doped drain region.

8. The method of claim 1, wherein the gate conductor comprises polysilicon.

9. The method of claim 1, wherein the gate dielectric comprises a material selected from the group consisting of barium strontium titanate, lead lanthanum zirconate titanate, barium zirconate titanate, cerium oxide, and tin oxide.

10. A method for forming a transistor, said method comprising:

forming a gate conductor upon a gate dielectric having a dielectric constant greater than approximately 3.8, wherein the gate conductor is interposed between a pair of opposed sidewall surfaces of the gate dielectric, and wherein the gate dielectric is arranged upon a portion of a semiconductor substrate;

forming a masking layer across a portion of the gate conductor, wherein the masking layer is arranged upon the portion of the gate conductor a spaced distance from the pair of opposed sidewall surfaces; and removing the gate conductor from the gate dielectric exclusive of the portion of the gate conductor and adjacent to the portion of the gate conductor, thereby exposing a selected region of the gate dielectric on either side of the portion of the gate conductor.

11. The method of claim 10, wherein said forming a masking layer comprises:

lithographically patterning a photoresist upon the gate conductor; and isotropically etching the photoresist such that the photoresist is arranged exclusively upon the portion of the gate conductor.

12. The method of claim 10, further comprising removing the masking layer subsequent to said removing the gate conductor.

13. The method of claim 12, further comprising forwarding a single impurity distribution into the substrate exclusive of underneath the gate conductor to concurrently form a lightly doped drain area underneath each selected region of the gate dielectric and a pair of source/drain regions laterally adjacent the lightly doped drain areas.

14. The method of claim 13, wherein a first concentration of the lightly doped drain areas is less than a second concentration of the source/drain regions.

15. The method of claim 14, wherein the lightly doped drain areas are substantially shallower than the source/drain regions.

16. The method of claim 14, wherein the semiconductor substrate comprises single crystalline silicon, and further comprising implanting atoms into exposed upper regions of the substrate to form amorphous layers within the exposed upper regions prior to said implanting a single impurity distribution.

17. The method of claim 16, wherein the atoms are selected from a group consisting of silicon and germanium.

18. A method for forming a transistor upon and within a semiconductor substrate, comprising:

forming a gate dielectric upon the semiconductor substrate;

forming a gate structure upon the gate dielectric;

removing a portion of the gate structure and underlying gate dielectric such that lateral extends of the remaining gate structure align directly over opposed sidewall surfaces of the gate dielectric;

removing an additional portion of the remaining gate structure from the gate dielectric a spaced distance from at least one of the opposed sidewall surfaces, thereby forming a gate conductor; and implanting dopants into the substrate partially through regions of the gate dielectric absent the gate conductor.

19. The method of claim 18, wherein said removing an additional portion of the remaining gate structures comprises etching the gate structure a substantially equal lateral distance from both of the opposed sidewall surfaces.

20. The method of claim 18, wherein said removing an additional portion of the remaining gate structures comprises etching the gate structure a lateral distance from only one of the opposed sidewall surfaces.

21. The method of claim 18, wherein said implanting comprises forwarding dopants into a drain region of the substrate laterally aligned with the gate dielectric concurrent with forwarding dopants into a lightly doped drain region between the drain region and a portion of the substrate aligned beneath the gate conductor after said removing the gate structure.

22. The method of claim 18, wherein said implanting comprises forwarding dopants into a drain region and a source region of the substrate laterally aligned with respective sidewall surfaces of the gate dielectric concurrent with forwarding dopants into a lightly doped drain region extending between a portion of the substrate aligned beneath the gate conductor and both the source and drain regions after said removing the gate structure.

* * * * *